(12) United States Patent
Yamada et al.

(10) Patent No.: US 7,109,058 B2
(45) Date of Patent: Sep. 19, 2006

(54) BUMPLESS SEMICONDUCTOR DEVICE

(75) Inventors: Yukio Yamada, Kanuma (JP);
Masayuki Nakamura, Kanuma (JP);
Hiroyuki Hishinuma, Kanuma (JP)

(73) Assignees: Sony Chemicals Corp., Tokyo (JP);
Sony Corporation, Tokyo (JP)

( * ) Notice: Subject to any disclaimer, the term of this patent is extended or adjusted under 35 U.S.C. 154(b) by 0 days.

(21) Appl. No.: 10/467,638

(22) PCT Filed: Feb. 18, 2002

(86) PCT No.: PCT/JP02/01357

§ 371 (c)(1),
(2), (4) Date: Aug. 11, 2003

(87) PCT Pub. No.: WO02/067317

PCT Pub. Date: Aug. 29, 2002

(65) Prior Publication Data

US 2004/0217460 A1    Nov. 4, 2004

(30) Foreign Application Priority Data

Feb. 19, 2001    (JP) ............................. 2001-042378

(51) Int. Cl.
*H01L 21/44* (2006.01)
(52) U.S. Cl. .................................................. 438/106
(58) Field of Classification Search ................ 438/123, 438/106, 121, 117, 107, 108, 612; 257/667, 257/676
See application file for complete search history.

(56) References Cited

U.S. PATENT DOCUMENTS

| 4,618,739 A | * | 10/1986 | Theobald ................... 174/52.4 |
| 5,034,245 A | | 7/1991 | Matsubara |
| 5,420,520 A | * | 5/1995 | Anschel et al. ............. 324/754 |
| 5,894,165 A | * | 4/1999 | Ma et al. ..................... 257/666 |
| 6,080,264 A | * | 6/2000 | Ball ............................ 156/292 |
| 6,223,429 B1 | * | 5/2001 | Kaneda et al. ................. 29/832 |

FOREIGN PATENT DOCUMENTS

EP    0 413 335 A2    2/1991

(Continued)

*Primary Examiner*—Howard Weiss
*Assistant Examiner*—(Vikki) Hoa B. Trinh
(74) *Attorney, Agent, or Firm*—Oliff & Berridge, PLC.

(57) ABSTRACT

When connecting a semiconductor device such as an IC chip with a circuit board by the flip-chip method, a semiconductor device is provided without forming bumps thereon, which enables highly reliable and low cost connection between the IC chip and circuit board while ensuring suppressing short-circuiting, lowering connection costs, suppressing stress concentrations at the joints and reducing damage of the IC chip or circuit board. The bumpless semiconductor device is provided with electrode pads 2 on the surface thereof and with a passivation film 3 at the periphery of the electrode pads 2, and conductive particles 4 are metallically bonded to the electric pads 2. Composite particles in which a metallic plating layer is formed at the surface of resin particles are employed as the conductive particles 4. This bumpless semiconductor device can be manufactured by (a) causing conductive particles to be electrostatically adsorbed onto one face of a flat plate; and (b) overlaying the surface of the plate having the adsorbed conductive particles on the surface of electrode pads of a bumpless semiconductor device which is provided with the electrode pads on the surface thereof and with a passivation film at the periphery of the electrode pads, and ultrasonically welding this assembly, so that the conductive particles are metallically bonded and transferred from the flat plate to the electrode pads.

4 Claims, 2 Drawing Sheets

FOREIGN PATENT DOCUMENTS

| | | |
|---|---|---|
| EP | 0 951 064 A1 | 10/1999 |
| JP | 54-152470 | 11/1979 |
| JP | 3-27542 A | 2/1991 |
| JP | A 03-185894 | 8/1991 |
| JP | A 4-79397 | 3/1992 |
| JP | 5-47839 | 2/1993 |
| JP | A 05-047839 | 2/1993 |
| JP | A 5-110243 | 4/1993 |
| JP | A 7-37890 | 2/1995 |

* cited by examiner

BUMPLESS SEMICONDUCTOR DEVICE

TECHNICAL FIELD

The present invention relates to a bumpless semiconductor device.

BACKGROUND ART

When a bare IC chip is connected to a circuit board by flip-chip method, a separation must be provided between the IC chip and the circuit board in order to prevent occurrence of short-circuiting at scribe lines that are not covered with passivation film. Connecting bumps of height of about 10 µm to 80 µm are therefore commonly formed on the IC chip (FIG. 3 to FIG. 5).

In the embodiment shown in FIG. 3, the gold bumps 31 of an IC chip 32 having gold bumps 31 formed by the stud bump method and a connection terminal 34 of a circuit board 33 are thermo-compression bonded using an anisotropic conductive adhesive 37 (film or paste) obtained by dispersing conductive particles 35 in a binder 36. Also, in the embodiment shown in FIG. 4, the gold bumps 41 of an IC chip 42 having gold bumps 41 formed by the stud bump method and a connection terminal 44 of a circuit board 43 are thermo-compression bonded using an insulating adhesive material 45 (film or paste).

It should be noted that, in the embodiments of FIG. 3 and FIG. 4, the adhesive force between the IC chip and the circuit board depends on the coagulative force of the binder (adhesive component) in the anisotropic conductive adhesive (insulating adhesive), since there is no mutual metallic bonding between the bumps 31 (41) and the connecting terminals 34 (44).

Also, in the case of the embodiment of FIG. 5, connection of solder bumps 51 and connecting terminals 54 is achieved by bringing the flux-treated connecting terminals 54 of a circuit board 53 into contact with the solder bumps 51 of an IC chip 52 formed with solder bumps 51 by a solder paste printing/reflow method or other method, and heating to above the melting point of the solder, where the gap between the IC chip 52 and the circuit board 53 is filled with an underfilling agent 55. In this case, usually, a washing operation is performed in order to remove the flux before filling with the underfilling agent 55.

However, the embodiments of FIG. 3 to FIG. 5 all presuppose the formation of bumps on the IC chip, which are costly to produce, so there are the problems that the freedom of the IC chip shape is lowered and it is difficult to reduce the cost of effecting connection between the IC chip and the circuit board.

Since, in the embodiments of FIG. 3 and FIG. 4, no metallic bonding is achieved between the bumps 31 (41) and the connecting terminals 34 (44), the adhesive force between the IC chip and the circuit board must depend on the coagulative force of the binder (adhesive component) in the anisotropic conductive adhesive (insulating adhesive). Thus there are the problems that reliability of connection in the case of the embodiment of FIG. 3 that employs an anisotropic conductive adhesive can be guaranteed, but in the case of the embodiment of FIG. 4, which does not employ an anisotropic conductive adhesive, the reliability of adhesion is lower than in the case of metallic bonding.

Furthermore, in the case of the embodiment of FIG. 3, with miniaturization of the bump pitch and miniaturization of the bump size, there is the problem that the risk of occurrence of short-circuiting is increased if the content ratio of conductive particles 35 in the anisotropic conductive adhesive 37 is increased in order to ensure the presence of such conductive particles 35 between the bumps 31 and connecting terminal 34. A further problem is that the cost of connection between the IC chip 32 and the circuit board 33 is increased due to the comparatively high cost of procurement of the conductive particles 35. In the case of the embodiment of FIG. 4, the bumps 41 and connecting terminals 44 are directly press-fixed without interposing conductive particles between the bumps 41 and the connecting terminals 44, so there is a problem of stress concentration at the joints, which further lowers connection reliability. Also, since the pressure during press-fixing must be high, there is a possibility of the IC chip or circuit board sustaining comparatively large-scale damage.

On the other hand, in the case of the embodiment of FIG. 5, although comparatively satisfactory connection reliability is achieved due to the metallic bonding between the solder bumps 51 and the connecting terminals 54, there is the problem that, if the bumps are made sufficiently large to ensure that metallic bonding is formed, it is difficult to make finer the pitch of the solder bumps 51. Additional problems are that a flux F washing step and underfilling agent 55 filling step are added.

The present invention was made in view of the above problems of the prior art. Its object is to make it possible to join an IC chip and a circuit board when connecting a semiconductor device such as a bare IC chip with a circuit board by the flip-chip method, with high reliability and low cost without forming bumps on the semiconductor device, while suppressing short-circuiting, lowering connection costs, suppressing stress concentrations at the joints and reducing damage of the IC chip or circuit board.

DISCLOSURE OF THE INVENTION

The present inventors discovered that metallic bonding of conductive particles exclusively with the electrode pads could be achieved by first electrostatically adsorbing the conductive particles on to a flat plate such as a glass plate, followed by fixing by ultrasonic wave pressure in which this surface of the flat plate with conductive particles adsorbed thereon is overlaid with the surface of a semiconductor device on the side of the electrode pads, and thereby succeeded in perfecting the present invention.

Specifically, according to the present invention, there is provided a bumpless semiconductor device comprising electrode pads provided on the surface thereof, and a passivation film formed at the periphery of the electrode pads, wherein conductive particles are metallically bonded to the electrode pads.

Also, according to the present invention, there is provided a method of manufacturing a bumpless semiconductor device, comprising the following steps (a) and (b):

(a) a step of causing conductive particles to be electrostatically adsorbed onto one face of a flat plate; and (b) a step of overlaying the surface of the plate having the adsorbed conductive particles on the surface of electrode pads of a bumpless semiconductor device which is provided with the electrode pads on the surface thereof and with a passivation film at the periphery of the electrode pads, and ultrasonically welding this assembly, so that the conductive particles are metallically bonded and transferred from the flat plate to the electrode pads.

Furthermore, according to the present invention, there is provided a connected structure, wherein this bumpless semiconductor device and a circuit board are joined by an insulating adhesive material so that conductive particles metallically bonded with the connecting pads of this bumpless semiconductor device may contact the connection terminals of the circuit board.

BEST MODE FOR CARRYING OUT THE INVENTION

The present invention is further described in detail below with reference to the drawings.

Figure 1:
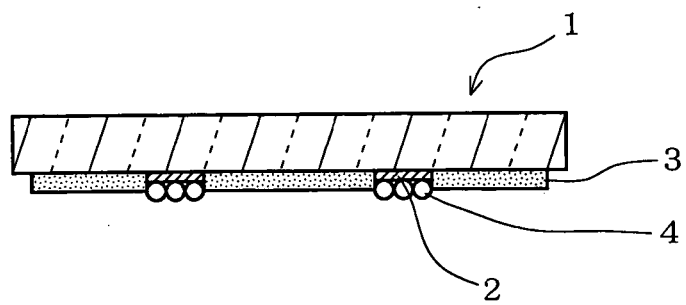
FIG. 1 is a diagrammatic cross-sectional view of a bumpless semiconductor device according to the present invention.
Figure 3:
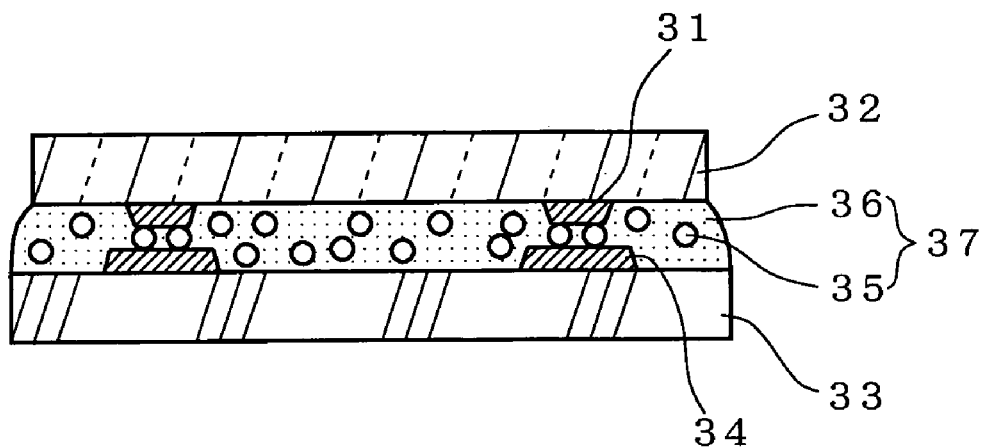
FIG. 3 is a diagram illustrating a prior art mode of connecting an IC chip and a circuit board.
Figure 4:
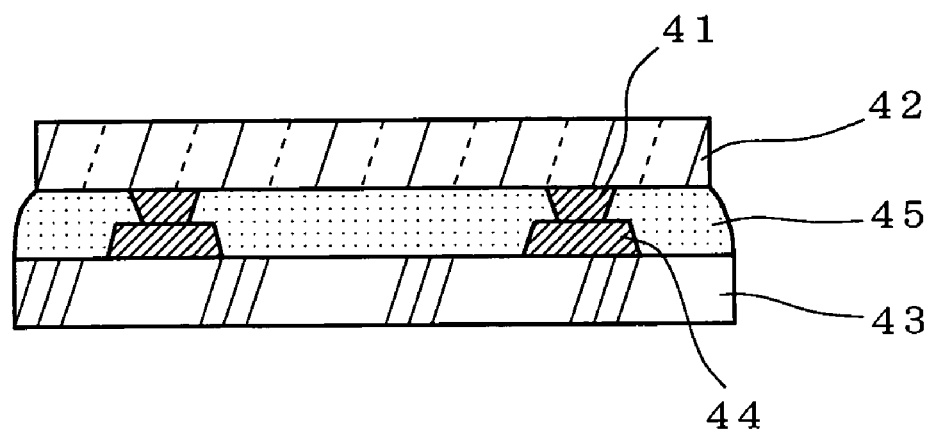
FIG. 4 is a diagram illustrating a prior art mode of connecting an IC chip and a circuit board.
Figure 5:
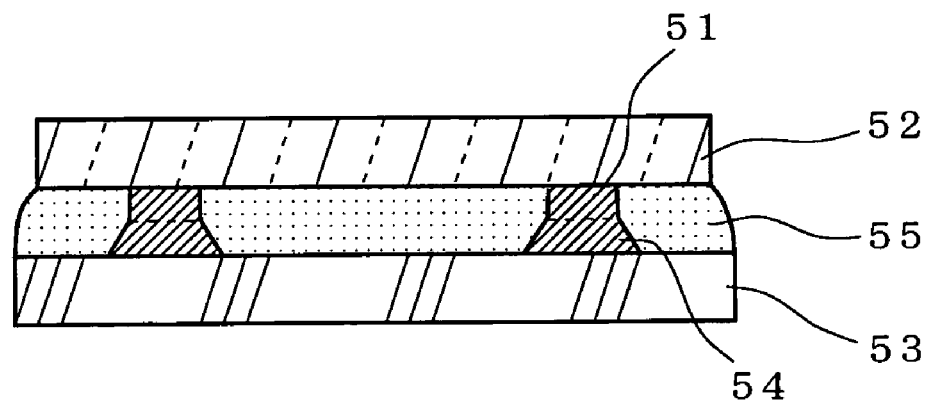
FIG. 5 is a diagram illustrating a prior art mode of connecting an IC chip and a circuit board.

FIG. 1 is an example in which a bumpless semiconductor device according to the present invention is applied to an IC chip. This IC chip 1 has a bumpless construction in which electrode pads 2 made of for example aluminum are provided at the surface thereof and a passivation film 3 whose surface position level is higher than the surface position level of the electrode pads 2 is provided at the periphery of the electrode pads 2. Also, conductive particles 4 are metallically bonded to the electrode pads 2. Consequently, the connection reliability between the electrode pads 2 and the conductive particles 4 rivals that of bumps formed on a conventional IC chip as shown in FIG. 3 to FIG. 5. Furthermore, when metallic bonding of the conductive particles 4 to the electrode pads 2 is effected, metallic bonding can be achieved by a comparatively low-cost technique such as ultrasonic welding, instead of the conventional complex and high-cost method of bump forming. Besides, the connection reliability between the conductive particles 4 and the connection terminals of the circuit board (connected element) is comparable with the conventional anisotropic conductor connection method, since connection is achieved by the presence of conductive particles 4.

According to the present invention, metallic particles comprising solder particles, nickel particles or other particles, or composite particles in which a metallic plating layer of, for example, nickel or gold is formed on the surface of a resin particle (core) made of, for example, benzoguanamine or the like may be employed as the conductive particles 4. Of these, use of composite particles with a resin particle core capable of moderating stress applied to the connected portion is preferred.

Regarding the particle diameter of the conductive particles 4, preferably at least some of the conductive particles 4 that are metallically bonded are of a size such as to project to the outside beyond the surface of the passivation film 3. Specifically, preferably they are larger than the difference of the surface levels of the passivation film 3 and the electrode pads 2. In this way, occurrence of short-circuiting at the scribe lines can be suppressed and the connection reliability with respect to the element to be connected (circuit board) can be improved. In this case, although the particle diameter of the conductive particles 4 may be made larger than the diameter of the electrode pads 2 in a range such that they are capable of metallic bonding with the electrode pads 2. Preferably, in order to suppress short-circuiting between the conductive particles 4 in the lateral direction more effectively, the particle diameter of the conductive particles 4 is made smaller than the diameter of the electrode pads 2. Specifically, the particle diameter of the conductive particles 4 is preferably between 1 and 50 μm and even more preferably between 3 and 40 μm in the case of metallic particles; in the case of a composite particles, the diameter of the resin particles is preferably 1 to 50 μm and even more preferably between 3 and 40 μm and the thickness of the metallic plating layer is preferably between 10 nm and 1 μm, or even more preferably between 15 nm and 1 μm.

Preferably, in order to reduce contact resistance, a thin gold plating layer of thickness between about 5 nm and 0.5 μm is formed as the outermost layer of the conductive particles 4.

As specific constructions of the IC chip 1, electrode pads 2 and passivation film 3 in the embodiment of FIG. 1, prior art constructions may be respectively employed.

Next, each step of a method of manufacturing a bumpless semiconductor device (IC chip) according to the present invention will be described.

Step (a)

As shown in FIG. 2(a), first of all, conductive particles 4 as described above are electrostatically adsorbed onto one face of a flat plate 21 such as a flat glass plate. In this case, in order to more effectively transfer the conductive particles during ultrasonic welding in step (b), they are preferably adsorbed as a single layer. As the technique for adsorbing the conductive particles 4 electrostatically onto the flat plate 21, the surface of the flat plate 21 may be electrostatically charged by wiping it with a polyester cloth or the like and the conductive particles 4 then dispersed over the surface. Conductive particles that have not been adsorbed can be removed by tilting or turning over the flat plate 21 or by gently vibrating the flat plate 21.

Step (b)

Next, as shown in FIG. 2(b), the surface of the flat plate 21 onto which the conductive particles have been adsorbed is overlaid with the electrode pad surface 2 of an IC chip 1 provided with electrode pads 2 on the surface thereof and a passivation film 3 at the periphery of the electrode pads 2 and ultrasonic welding is performed preferably from the direction of the arrow (FIG. 2(c)). In this way, the conductive particles 4 can be transferred from this flat plate 21 to the electrode pads 2 by metallic bonding with the electrode pads 2. It should be noted that transfer of the conductive particles 4 onto the passivation film 3, which is an insulating film, does not take place, since the conductive particles 4 cannot perform metallic bonding therewith.

As example conditions for welding, there may be mentioned application of a frequency between 10 and 100 KHz with a pressure between 1 and 100 MPa (per electrode pad) for between 0.1 and 20 sec. As a specific example of equipment that may be employed, the Ultrasonic Micro Welding System (SH40MP, manufactured by ULTAX Inc) can be given.

Step (c)

If necessary, any conductive particles 4 that have become attached to the passivation film 3 may then be removed by transferring onto commercially available tacky adhesive tape or blowing off by airblow processing, to obtain the bumpless semiconductor device (IC chip) 1 shown in FIG. 2(d).

Figure 2:
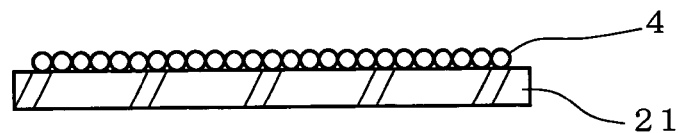
FIGS. 2(a) to 2(d) are process diagrams for manufacturing a bumpless semiconductor device and connected structure according to the present invention.
Figure 2:
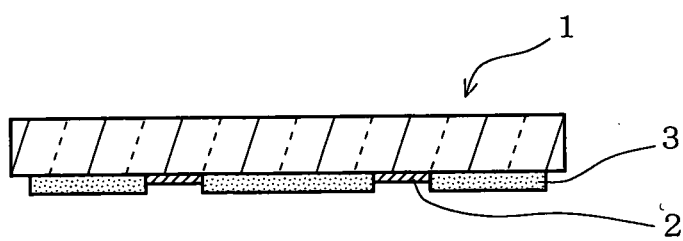
Figure 2:
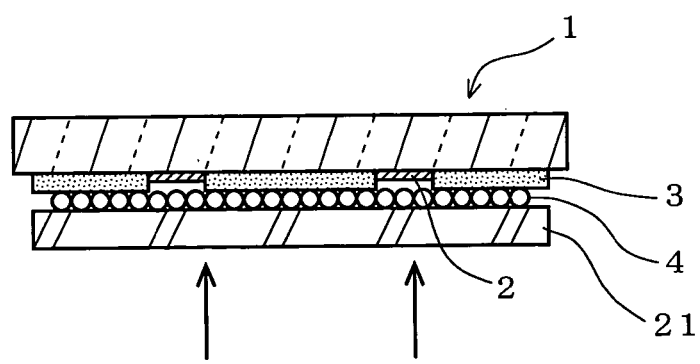
Figure 2:
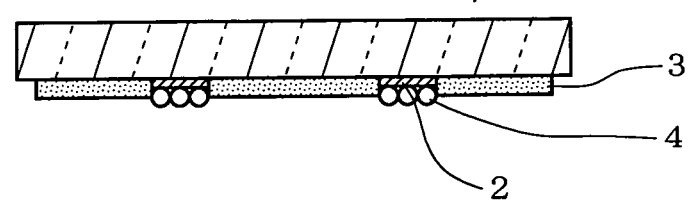
Figure 2:
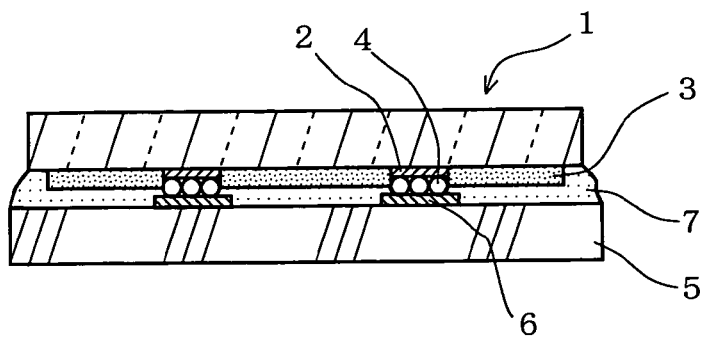

With the bumpless semiconductor device (IC chip) 1 shown in FIG. 2(*d*), a connected structure having high connection reliability can be achieved. Specifically, a connected structure (FIG. 2(*e*)) may be presented in which a bumpless semiconductor device 1 and a circuit board 5 are joined by a known insulating adhesive material 7 in the form of a film or paste so that conductive particles 4 that are metallically bonded with the connecting pads 2 may contact the connecting terminals 6 of the circuit board 5.

EXAMPLES

A specific description of the present invention is given below with reference to Examples thereof.

Examples 1 to 8 and Comparative Examples 1 to 4

After wiping one face of a flat glass plate with polyester cloth, the conductive particles of Table 1 were distributed and adsorbed onto this surface. The excess conductive particles were removed by tilting the glass plate and vibrating it gently. In the case of practical example 6, metallic particles provided with an Au plated layer on the surface of an Ni core were employed as the conductive particles but, in the other practical examples and the comparative examples, composite particles in which an Ni plated layer and Au plated layer were formed on the surface of benzoguanamine (core resin particles) were employed.

The conductive particles adsorption face of this flat glass plate was overlaid with the electrode pad formation face of a 10 mm square IC chip provided with 500 of aluminum electrode pads on one face thereof in a pitch of 80 μm, and subjected to an ultrasonic welding treatment (frequency 10, 50 or 100 kHz, pressure 49 MPa, treatment time 10 sec), using an ultrasonic welding device (Ultrasonic Micro Welding System (SH40MP, manufactured by ULTAX Inc), from the side of the flat glass plate. The conductive particles were thereby transferred by metallic bonding to the electrode pads of the IC chip. Excess conductive particles adhering to the passivation film were blown away by airblow treatment, to obtain the bumpless semiconductor device (IC chip) shown in FIG. 1.

TABLE 1

| | Conductive particles | | | Ultrasonic |
| --- | --- | --- | --- | --- |
| | Core resin particle diameter (μm) | Ni plating thickness (μm) | Au plating thickness (nm) | welding frequency (kHz) |
| Ex. 1 | 5 | 0.15 | 20 | 50 |
| Ex. 2 | 1 | 0.15 | 20 | 50 |
| Ex. 3 | 50 | 0.15 | 20 | 50 |
| Ex. 4 | 5 | 0.15 | 10 | 50 |
| Ex. 5 | 5 | 0.15 | 1000 | 50 |
| Ex. 6 | 10 | — | 20 | 50 |
| Ex. 7 | 5 | 0.15 | 20 | 10 |
| Ex. 8 | 5 | 0.15 | 20 | 100 |
| Comp. EX. 1 | 0.5 | 0.15 | 10 | 50 |
| Comp. EX. 2 | 55 | 0.15 | 20 | 10 |
| Comp. EX. 3 | 5 | 0.15 | 20 | 50 |
| Comp. EX. 4 | 5 | 0.15 | 1100 | 50 |

Next, the electrode pads of the bumpless semiconductor device obtained were positionally aligned with the connecting terminals (circuit pattern (80 μm pitch) obtained by gold plating onto copper of height 8 μm) of a polyimide circuit board of thickness 25 μm, a thermo-setting epoxy insulating adhesive film (obtained by removing the conductive particles from anisotropic conductive adhesive film (FP16613, manufactured by Sony Chemicals) was sandwiched therebetween, and the assembly was thermo-compression bonded under the conditions of temperature 190° C., pressure 1960 kPa, and 10 sec, to obtain a connected structure.

When the connected structure obtained was subjected to a thermal shock test (1000 cycles) between −55° C. and 125° C., the connected structure using the bumpless semiconductor devices of practical examples 1 to 5 and 7 to 8 displayed excellent connection reliability, the rise in resistance being in each case no more than 10 mΩ. Also, the rise in resistance of the connected structure employing the bumpless semiconductor device of Example 6 was about 200 mΩ, which is a level that presents no practical problems.

In contrast, in the case of the connected structure employing the bumpless semiconductor device of comparative example 1, the rise in resistance exceeded 1 Ω, because the core resin particle diameter was too small. In the case of the connected structure employing the bumpless semiconductor device of comparative example 2, the core resin particle diameter was too large, so some of the particles appeared that could not be carried on the pads, causing the initial resistance value to become large, with the result that this connected structure was unsuitable for use. In the case of the connected structure using the bumpless semiconductor device of comparative example 3, the thickness of the metallic plating layer at the surface of the core resin particles was too thin, so electrode pads appeared where no conductive particles were transferred, causing the initial resistance value to become high, with the result that this connected structure was unsuitable for use. Also, in the case of the connected structure using the bumpless semiconductor device of comparative example 4, the thickness of the metallic plating layer at the surface of the core particles was too thick, so the conductive particles coagulated, generating short-circuits.

INDUSTRIAL APPLICABILITY

According to the present invention, when a semiconductor device such as an IC chip is connected with a circuit board by the flip-chip method, the IC chip and the circuit board can be connected with high reliability and low cost while suppressing short-circuits, reducing the connection cost, suppressing stress concentrations in the joints and reducing damage to the IC chip or circuit board, without forming bumps on the semiconductor device.

The invention claimed is:

1. A method of manufacturing a bumpless semiconductor device, comprising the following steps (a) and (b):
    (a) a step of causing conductive particles to be electrostatically adsorbed onto one face of a flat plate; and
    (b) a step of overlaying the surface of the plate having the adsorbed conductive particles on the surface of electrode pads of a bumpless semiconductor device which is provided with the electrode pads on the surface thereof and with a passivation film at the periphery of the electrode pads, and ultrasonically welding this assembly, so that the conductive particles are metallically bonded and transferred from the flat plate to the electrode pads.

2. The method of manufacturing a bumpless semiconductor device according to claim 1, further comprising forming a metallic plating layer on a surface of resin particles, wherein the conductive particles are composite particles.

3. The method of manufacturing a bumpless semiconductor device according to claim 2, wherein a diameter of the resin particles is between 1 and 50 μm and a thickness of the metallic plating layer is between 10 nm and 1 μm.

4. The method of manufacturing a bumpless semiconductor device according to claim 2, wherein at least some of the conductive particles that are metallically bonded project to the outside of the surface of the passivation film.

* * * * *